(12) United States Patent
Fujii et al.

(10) Patent No.: US 10,333,062 B2
(45) Date of Patent: Jun. 25, 2019

(54) SUBSTRATE LIQUID PROCESSING METHOD, SUBSTRATE LIQUID PROCESSING APPARATUS, AND STORAGE MEDIUM

(71) Applicant: Tokyo Electron Limited, Tokyo (JP)

(72) Inventors: Yasushi Fujii, Yamanashi (JP); Takayuki Toshima, Hillsboro, OR (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/768,217

(22) PCT Filed: Oct. 14, 2016

(86) PCT No.: PCT/JP2016/080564
§ 371 (c)(1),
(2) Date: Apr. 13, 2018

(87) PCT Pub. No.: WO2017/065282
PCT Pub. Date: Apr. 20, 2017

(65) Prior Publication Data
US 2018/0301623 A1    Oct. 18, 2018

(30) Foreign Application Priority Data

Oct. 16, 2015  (JP) ................................. 2015-204798

(51) Int. Cl.
| | |
|---|---|
| *H01L 21/00* | (2006.01) |
| *H01L 43/12* | (2006.01) |
| *H01L 21/304* | (2006.01) |
| *H01L 43/08* | (2006.01) |
| *H01L 27/22* | (2006.01) |

(52) U.S. Cl.
CPC ............ *H01L 43/12* (2013.01); *H01L 21/304* (2013.01); *H01L 27/222* (2013.01); *H01L 43/08* (2013.01)

(58) Field of Classification Search
CPC ..... H01L 43/12; H01L 21/304; H01L 27/222; H01L 43/08
See application file for complete search history.

(56) References Cited

U.S. PATENT DOCUMENTS 5,195,299 A * 3/1993 Nguyen .................. H01L 23/26
                                                           252/181.1
2019/0025702 A1* 1/2019 Kamimura ................ G03F 7/32

FOREIGN PATENT DOCUMENTS

| JP | 2002-314170 A | 10/2002 |
|---|---|---|
| WO | 2016/006456 A | 1/2016 |

OTHER PUBLICATIONS

International Search Report dated Nov. 15, 2016 for WO 2017/065282 A1.

* cited by examiner

*Primary Examiner* — Richard A Booth
(74) *Attorney, Agent, or Firm* — Abelman, Frayne & Schwab

(57) ABSTRACT

Provided is a substrate including a first magnetic layer, a second magnetic layer, and a tunnel insulating layer formed of magnesium oxide and disposed between the first magnetic layer and the second magnetic layer. A cleaning liquid is supplied to the substrate to clean the substrate and then, a rinsing liquid is supplied to the substrate to rinse the cleaning liquid. The concentration of moisture contained in the cleaning liquid and the rinse liquid is than 3 wt % or less.

9 Claims, 6 Drawing Sheets

SUBSTRATE LIQUID PROCESSING METHOD, SUBSTRATE LIQUID PROCESSING APPARATUS, AND STORAGE MEDIUM

CROSS REFERENCE TO RELATED APPLICATIONS

This application is a national phase of PCT application No. PCT/JP2016/080564, filed on 14 Oct. 2016, which claims priority from Japanese Patent Application No. 2015-204798, filed on 16 Oct. 2015, all of which are incorporated herein by reference.

TECHNICAL FIELD

The present disclosure relates to a substrate liquid processing method, a substrate liquid processing apparatus, and a storage medium.

BACKGROUND

In recent years, a magnetic random access memory (MRAM), which is one of nonvolatile memories, has attracted attention as a next generation semiconductor memory device. As a cell of the MRAM, a tunnel magnetoresistive element having a structure in which a tunnel insulating layer is sandwiched between two ferromagnetic layers (magnetic layers) is expected as a device which is closest to practical use because it has a high magnetoresistance change rate (see Patent Document 1). As the tunnel insulating layer constituting the tunnel magnetoresistive element, magnesium oxide (MgO), which is a material having a high magnetoresistance change rate, has attracted attention.

PRIOR ART DOCUMENT

Patent Document

Patent Document 1: Japanese Patent Laid-Open Publication No. 2002-314170

However, in general, in a semiconductor device manufacturing process, a cleaning processing is performed in order to remove contaminants such as, for example, particles or polymers attached to the surface of a substrate such as, for example, a semiconductor wafer by supplying a cleaning liquid containing moisture such as, for example, SC-1 (a mixed solution of ammonia water and a hydrogen peroxide solution) to the surface of the substrate. When this cleaning processing is performed using a single wafer cleaning apparatus, the substrate is held by a substrate holder, which is called a spin chuck, and is rotated around a vertical axis. The cleaning liquid is supplied to the substrate from a nozzle, which is located above the rotating substrate. After the cleaning processing using the cleaning liquid is performed, the cleaning liquid and contaminants are washed off with a rinsing liquid containing moisture such as, for example, pure water (DIW).

In the same manner as the semiconductor device manufacturing process described above, in a manufacturing process of manufacturing an MRAM, it is considered that a cleaning processing is performed using a cleaning liquid containing moisture in order to remove polymers on a substrate after dry-etching a magnetic material. However, in this case, the moisture in the cleaning liquid reacts with magnesium oxide constituting a tunnel insulating layer, whereby strong alkaline magnesium hydroxide is produced. In this case, the substrate may be corroded by the magnesium hydroxide. For this reason, it is considered that it is difficult to perform a cleaning processing of removing the polymers using the cleaning liquid containing moisture with respect to a semiconductor wafer for the MRAM containing magnesium oxide. However, when the cleaning processing is not performed, etching residues may be generated due to the polymers attached to the substrate, or the yield may decrease.

The present disclosure has been made in view of the above circumstances, and provides a substrate liquid processing method, a substrate liquid processing apparatus, and a storage medium, in which a wafer cleaning processing can be performed without corroding a wafer for an MRAM including a magnesium oxide layer.

DISCLOSURE OF THE INVENTION

A substrate liquid processing method according to one exemplary embodiment of the present disclosure includes preparing a substrate including a first magnetic layer, a second magnetic layer, and a tunnel insulating layer formed of magnesium oxide and disposed between the first magnetic layer and the second magnetic layer, cleaning the substrate by supplying a cleaning liquid to the substrate, and rinsing the cleaning liquid by supplying a rinsing liquid to the substrate, wherein a concentration of moisture contained in the cleaning liquid and the rinsing liquid is 3 wt % or less.

A substrate liquid processing apparatus according to one exemplary embodiment of the present disclosure includes a substrate holder configured to hold a substrate including a first magnetic layer, a second magnetic layer, and a tunnel insulating layer formed of magnesium oxide and disposed between the first magnetic layer and the second magnetic layer, a cleaning liquid nozzle configured to supply a cleaning liquid, which cleans the substrate, to the substrate, and a rinse nozzle configured to supply a rinsing liquid, which rinses the cleaning liquid, to the substrate, wherein a concentration of moisture contained in the cleaning liquid and the rinsing liquid is 3 wt % or less.

According to the above exemplary embodiments of the present disclosure, it is possible to perform a cleaning processing on a substrate for an MRAM including a magnesium oxide layer without corroding the substrate.

DETAILED DESCRIPTION TO EXECUTE THE INVENTION

Hereinafter, an exemplary embodiment of the present disclosure will be described with reference to FIGS. 1 to 6.

Figure 1:
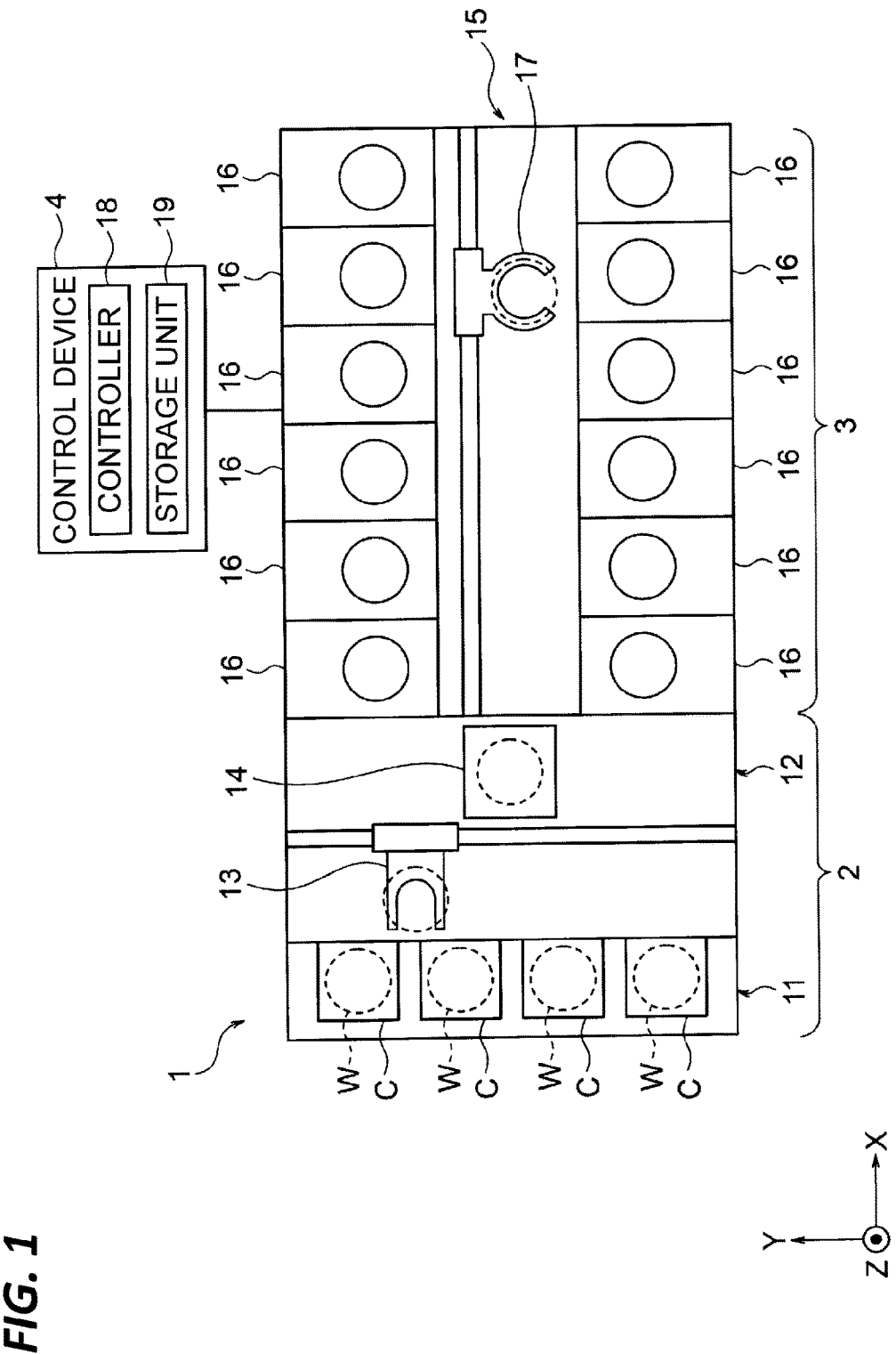
FIG. 1 is a plan view illustrating an outline of a substrate processing system according to an exemplary embodiment of the present disclosure.

FIG. 1 is a plan view illustrating an outline of a substrate processing system according to an exemplary embodiment of the present disclosure. In the following, in order to clarify positional relationships, the X-axis, Y-axis, and Z-axis which are orthogonal to each other will be defined. The positive Z-axis direction will be regarded as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the substrate processing system 1. The controller 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
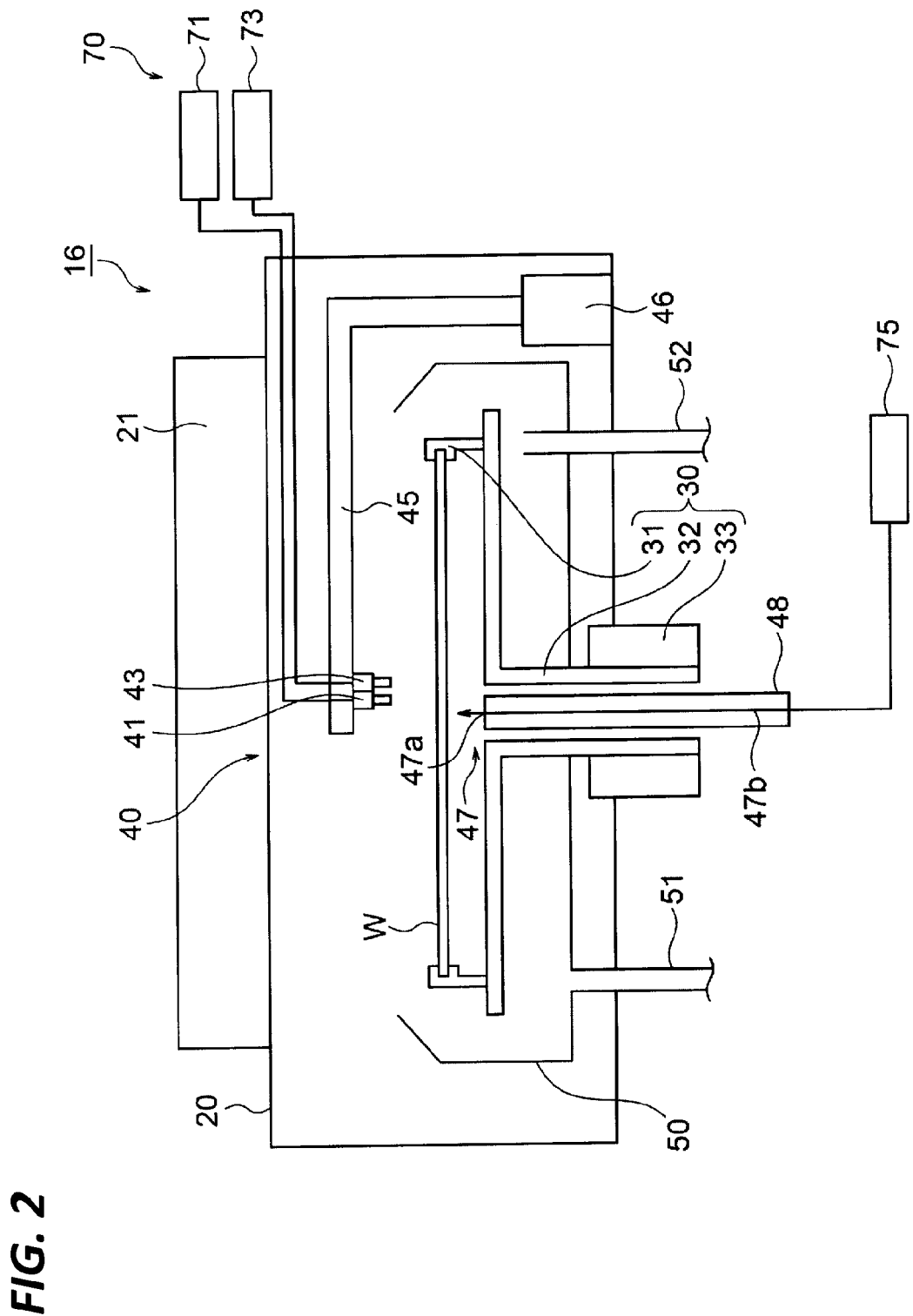
FIG. 2 is a longitudinal sectional view illustrating an outline of a processing unit (substrate liquid processing apparatus) according to an exemplary embodiment of the present disclosure.

Next, an outline of the processing unit (substrate liquid processing apparatus) 16 will be described with reference to FIG. 2. FIG. 2 is a view illustrating an outline of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion rotatably supported by the driving unit 33 and a tip end portion horizontally supporting the holding unit 31. The driving unit 33 rotates the support unit 32 around the vertical axis. The substrate holding mechanism 30 rotates the support unit 32 using the driving unit 33, so that the holding unit 31 supported by the support unit 32 is rotated, and hence, the wafer W held in the holding unit 31 is rotated.

The processing fluid supply unit 40 supplies a processing fluid to the wafer W. The processing fluid supply unit 40 is connected to a processing fluid supply source 70.

The recovery cup 50 is disposed to surround the holding unit 31, and collects a processing liquid scattered from the wafer W by the rotation of the holding unit 31. A drain port 51 is formed in the bottom of the recovery cup 50, and the processing liquid collected by the recovery cup 50 is discharged from the drain port 51 to the outside of the processing unit 16. Further, an exhaust port 52 is formed in the bottom of the recovery cup 50 so as to discharge a gas supplied from the FFU 21 to the outside of the processing unit 16.

Figure 3:
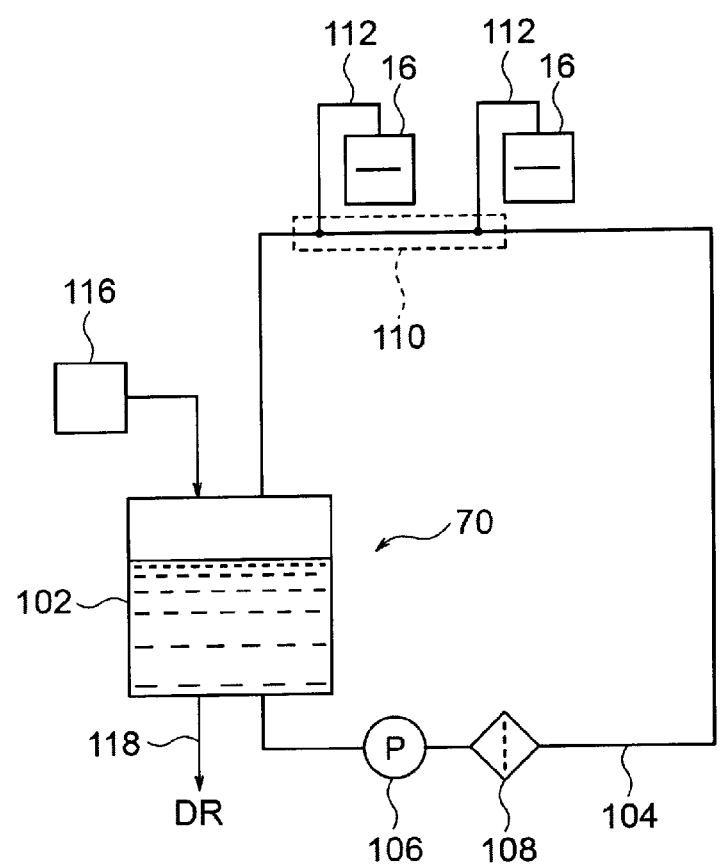
FIG. 3 is a pipe system diagram illustrating a configuration of a processing fluid supply source according to an exemplary embodiment of the present disclosure.

As illustrated in FIG. 3, a liquid processing apparatus is provided with the plurality of processing units 16, which performs a liquid processing on the wafers W, and the processing fluid supply source 70, which supplies the processing liquid to the processing units 16.

The processing fluid supply source 70 is provided with a tank 102, which stores the processing liquid, and a circulation line 104, through which the processing liquid from the tank 102 returns to the tank 102. The circulation line 104 is provided with a pump 106. The pump 106 forms a circulating flow, which gets out of the tank 102 and passes through the circulation line 104 to return to the tank 102. The circulation line 104 is provided on the downstream side of the pump 106 with a filter 108, which removes contaminants such as, for example, particles contained in the processing liquid. Auxiliary machinery (e.g., a heater) may be further provided on the circulation line 104, as necessary.

One or more branch lines 112 are connected to a connection region 110 set in the circulation line 104. Each branch line 112 supplies the processing liquid flowing through the circulation line 104 to a corresponding processing unit 16. Each branch line 112 may be provided with, for example, a flow rate adjustment mechanism such as, for example, a flow rate control valve or a filter, as necessary.

The liquid processing apparatus is provided with a tank liquid replenishing unit 116, which replenishes the processing liquid or processing liquid constituents to the tank 102. The tank 102 is provided with a drain unit 118 for discarding the processing liquid in the tank 102.

Further, the processing fluid supply source 70 is provided with a cleaning liquid supply mechanism 71 and a rinsing liquid supply mechanism 73 to be described later. In this case, the cleaning liquid supply mechanism 71 and the rinsing liquid supply mechanism 73 each has a pipe system illustrated in FIG. 3. Further, in the cleaning liquid supply mechanism 71, the processing liquid stored in the tank 102 is a cleaning liquid to be described later. In the rinsing liquid supply mechanism 73, the processing liquid stored in the tank 102 is a rinsing liquid to be described later.

The processing fluid supply unit 40 and the processing fluid supply source 70 according to the present exemplary embodiment will be described in more detail. The processing fluid supply unit 40 is provided with a cleaning liquid nozzle 41, which discharges a cleaning liquid as the processing liquid to the upper surface of the wafer W (the surface of the wafer on which a device is formed), and a rinse nozzle 43, which supplies a rinsing liquid to the upper surface of the wafer W.

The cleaning liquid nozzle 41 and the rinse nozzle 43 are attached to the tip end portion of a nozzle arm 45. The nozzle arm 45 is pivotable around the vertical axis by an arm driving unit 46, and may also be raised and lowered in the vertical direction. Thereby, the cleaning liquid nozzle 41 and the rinse nozzle 43 are movable between a processing position above the wafer W and a retreat position outside the recovery cup 50 when viewed in a plan view.

The cleaning liquid supplied from the cleaning liquid nozzle 41 is formed of a liquid substantially containing no moisture. The cleaning liquid may be any one as long as it can remove contaminants such as, for example, particles or polymers attached to the surface of the wafer W. As such a cleaning liquid, for example, an organic solvent containing N-methyl-2-pyrrolidone, a glycol and a surfactant may be mentioned.

Further, the rinsing liquid supplied from the rinse nozzle 43 is formed of a liquid substantially containing no moisture. The rinsing liquid washes away the cleaning liquid and contaminants contained in the cleaning liquid from the wafer W. As such a rinsing liquid, for example, an organic solvent such as, for example, isopropyl alcohol (IPA) may be mentioned. Further, the rinsing liquid is formed of a different kind of liquid from the cleaning liquid.

In the present exemplary embodiment, the phrase "a liquid substantially containing no moisture" includes not only a case where the liquid does not contain any moisture, but also a state where moisture such as, for example, that in air is inevitably dissolved in the liquid. Even if moisture is dissolved in the liquid, the moisture may have a concentration that does not corrode the wafer W. Specifically, the concentration of moisture contained in the liquid may be 3 wt % or less, and may be, for example, 1 wt % or less.

A lower nozzle 47, which supplies, as the processing fluid, the processing liquid such as, for example, IPA to the lower surface of the wafer W, is further provided on the lower surface side of the wafer W (the back surface of the wafer on which no device is formed).

The lower nozzle 47 has a processing fluid discharge port 47a, which discharges the processing fluid. The processing fluid discharge port 47a is configured as an opening formed in the upper end of a processing fluid passage 47b, which vertically extends inside a processing fluid supply column 48. The processing fluid supply column 48 is provided coaxially with the support unit 32 in the hollow support unit 32 (i.e., the rotation axis) of the substrate holding mechanism 30, and is supported so as not to be rotated even when the support unit 32 is rotated.

The processing fluid supply source 70 is provided with a cleaning liquid supply mechanism 71, which supplies a cleaning liquid substantially containing no moisture to the cleaning liquid nozzle 41, and a rinsing liquid supply mechanism 73, which supplies a rinsing liquid substantially containing no moisture to the rinse nozzle 43. Further, a processing fluid supply mechanism 75 is connected to the lower nozzle 47 to supply processing fluid to the processing fluid discharge port 47a of the lower nozzle 47.

As the cleaning liquid supply mechanism 71, the rinsing liquid supply mechanism 73, and the processing fluid supply mechanism 75, general ones well known in the field of semiconductor manufacturing apparatuses may be used. That is, as illustrated in FIG. 3, these supply mechanisms may be configured with a pipe, which connects a processing fluid reservoir such as, for example, a liquid storage tank to a corresponding nozzle, and a flow rate control device such as, for example, an opening/closing valve or a flow rate control valve.

Figure 4:
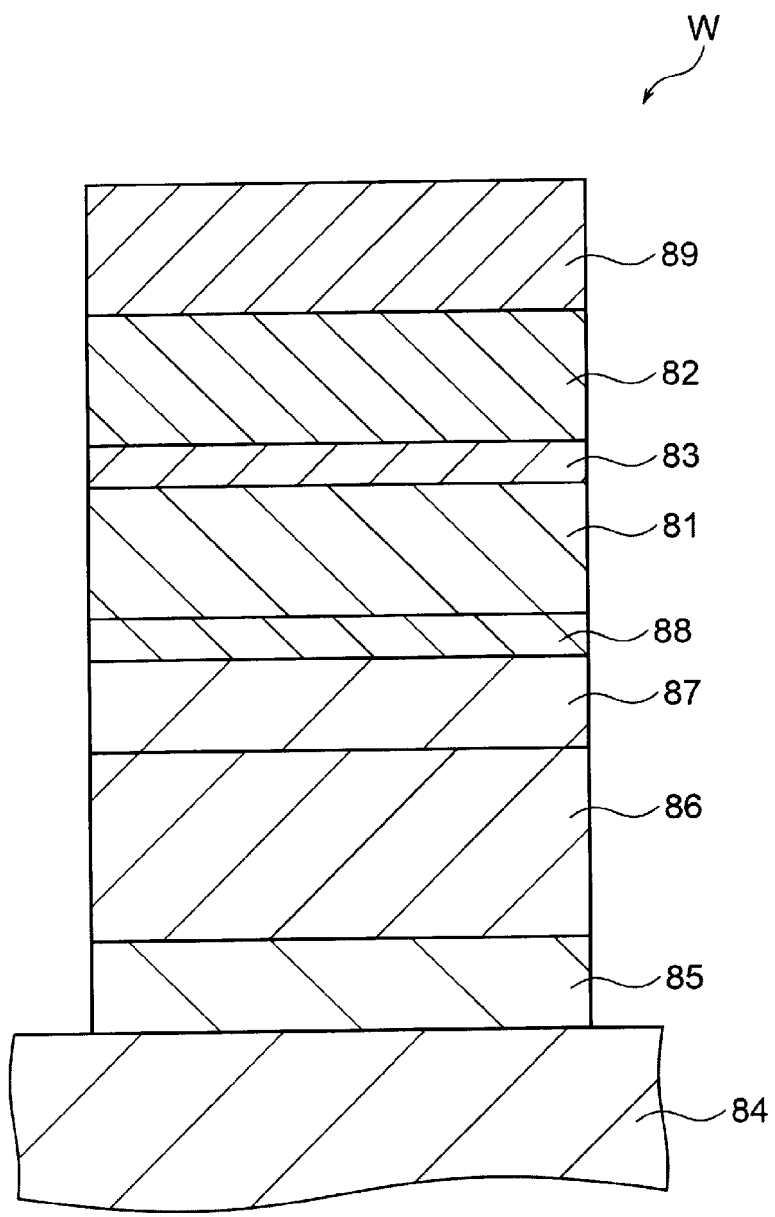
FIG. 4 is a cross-sectional view schematically illustrating a wafer to be cleaned using a processing unit (substrate liquid processing apparatus) according to an exemplary embodiment of the present disclosure.

Next, a configuration of the above-described wafer W (substrate) will be described with reference to FIG. 4. FIG. 4 is a cross-sectional view schematically illustrating the wafer W to be cleaned using the processing unit 16 according to the present exemplary embodiment. The wafer W illustrated in FIG. 4 is used to manufacture an electronic device that utilizes the effect of a TMR such as, for example, an MRAM. The wafer W may be, for example, an MTJ element of an in-plane magnetization type. The wafer W includes a first magnetic layer 81, a second magnetic layer 82, and a tunnel insulating layer 83 disposed between the first magnetic layer 81 and the second magnetic layer 82. Among these, the tunnel insulating layer 83 is formed of a magnesium oxide (MgO) layer. In addition, the first magnetic layer 81 and the second magnetic layer 82 may be magnetic metal layers such as, for example, a Co—Fe—B layer.

Further, the wafer W includes a substrate main body 84, an underlying layer 85 provided on the substrate main body 84, an antiferromagnetic layer 86 provided on the underlying layer 85, and a third magnetic layer 87 provided on the antiferromagnetic layer 86, a fourth magnetic layer 88 provided on the third magnetic layer 87, and a cap layer 89 provided on the second magnetic layer 82. In one exemplary embodiment, the substrate body 84 is a Si substrate, the underlying layer 85 is a Ta layer, the antiferromagnetic layer 86 is an Mn—Pt layer, the third magnetic layer 87 is a Co—Fe layer, the fourth magnetic layer 88 is a Ru layer, and the cap layer 89 is a Ta layer. However, the present disclosure is not limited to this, and a plurality of layers containing metals such as, for example, Pt, Pd, Co, Ta, Ru, CoFeB, and CoPt may be stacked on the substrate main body 84.

Next, a series of processes (substrate liquid processing method) performed by the processing unit 16 in FIG. 2 will be described. Here, a processing of removing polymers attached to the surface of the wafer W described above is performed.

First, the wafer W including the first magnetic layer 81, the second magnetic layer 82, and the tunnel insulating layer 83 formed of magnesium oxide, on which a cleaning processing will be performed in the processing unit 16, is prepared. Specifically, before performing the cleaning processing in the processing unit 16, a film forming process, an annealing process, and a dry etching process are sequentially performed to obtain the wafer W.

Among these, in the film forming process, the underlying layer 85, the antiferromagnetic layer 86, the third magnetic layer 87, the fourth magnetic layer 88, the first magnetic layer 81, the tunnel insulating layer 83, the second magnetic layer 82, and the cap layer 89 are sequentially formed on the substrate main body 84. These films are formed using a film forming apparatus such as, for example, a sputtering apparatus. Subsequently, in the annealing process, each film formed on the substrate main body 84 is subjected to heat treatment (magnetic annealing) in a strong magnetic field to develop its magnetic properties. Thereafter, in the dry etching process, each film formed on the substrate main body 84 is dry-etched, so that each film on the substrate main body 84 is formed in a predetermined pattern.

Next, a processing of removing polymers attached to the surface of the wafer W is performed in the processing unit 16 of FIG. 2. As described above, the tunnel insulating layer 83 of the wafer W is formed of a magnesium oxide (MgO) layer. Magnesium oxide easily reacts with moisture to thereby be hydroxylated, thus becoming strong alkaline magnesium hydroxide. Therefore, when moisture is contained in the cleaning liquid or the rinsing liquid at the time of removing polymers attached to the wafer W, magnesium hydroxide is produced from the magnesium oxide of the tunnel insulating layer 83, which may corrode the wafer W. In the present exemplary embodiment, the wafer W is cleaned and rinsed using the cleaning liquid and the rinsing liquid substantially containing no moisture, whereby the polymers are reliably removed without corroding the wafer W. The following processes are automatically performed under the control of the control device 4, as described above.

First, the wafer W before cleaning is carried into the processing unit 16 by an arm of the substrate transfer device 17 (see FIG. 1), and the wafer W is held by the substrate holding mechanism 30.

<Cleaning Process>

The wafer W is rotated around the vertical axis by the substrate holding mechanism 30. The rotational speed of the wafer W at this time may be, for example, 100 rpm or more and 2000 rpm or less.

Next, the cleaning liquid nozzle 41 is positioned right above the central portion of the wafer W. The cleaning liquid is supplied from the cleaning liquid supply mechanism 71 to the cleaning liquid nozzle 41 at the controlled temperature and flow rate, and the cleaning liquid is discharged from the cleaning liquid nozzle 41 to the wafer W (see FIG. 5A). At this time, the discharge flow rate of the cleaning liquid from the cleaning liquid nozzle 41 may be, for example, 100 ml/sec or more and 2000 ml/sec or less. Further, the discharge temperature of the cleaning liquid may be, for example, 20° C. or more and may be lower than the boiling point of the cleaning liquid. Thereby, the wafer W is subjected to a cleaning processing. The cleaning liquid is scattered from the wafer W by a centrifugal force and is received by the recovery cup 50. Thereafter, the cleaning liquid is discharged from the recovery cup 50 to the outside of the processing unit 16 through the drain port 51. As described above, the cleaning liquid is formed of a liquid substantially containing no moisture, for example, an organic solvent containing, for example, N-methyl-2-pyrrolidone, a glycol and a surfactant. Therefore, there is no possibility that magnesium oxide contained in the tunnel insulating layer 83 of the wafer W reacts with moisture in the cleaning liquid to thereby be hydroxylated. Further, the cleaning liquid does not adversely affect layers other than the tunnel insulating layer 83 included in the wafer W.

When the wafer W is cleaned by the cleaning liquid, the nozzle arm 45 may be pivoted to move the discharge position of a droplet of the cleaning liquid, discharged from the cleaning liquid nozzle 41 with respect to the surface of the wafer W, from the central portion to the peripheral edge portion of the wafer W. Further, the discharge position of the droplet of the cleaning liquid may be reciprocated once or a plurality of times from the central portion to the peripheral edge portion of the wafer W. Thereby, the surface of the wafer W may be cleaned without spots.

Further, at this time, the processing fluid such as, for example, IPA may be supplied from the processing fluid supply mechanism 75 to the lower nozzle 47, and the processing fluid may be discharged from the processing fluid discharge port 47a of the lower nozzle 47 toward the central portion of the lower surface of the wafer W. The processing fluid flows while spreading on the lower surface of the wafer W toward the peripheral edge of the wafer W by a centrifugal force, whereby the lower surface of the wafer W is covered with the processing fluid. By supplying the processing fluid to the back surface of the wafer W in this way, the back surface of the wafer W is also cleaned. Further, the processing fluid supplied from the lower nozzle 47 may be formed of a liquid substantially containing no moisture such as, for example, IPA. In this case, since moisture in the atmosphere in the chamber 20 is not increased by the liquid from the lower nozzle 47, dissolution of moisture in the atmosphere in the cleaning liquid or the rinsing liquid is prevented. Thereby, it is possible to more effectively prevent the magnesium oxide contained in the tunnel insulating layer 83 from reacting with moisture to thereby be hydroxylated.

<Rinsing Process>

Figure 5A:
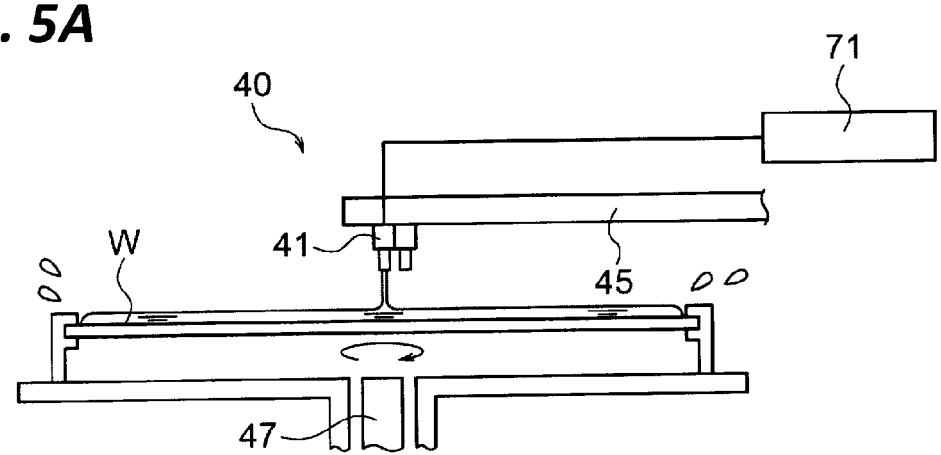
FIGS. 5A to 5C are schematic cross-sectional views illustrating a substrate liquid processing method according to an exemplary embodiment of the present disclosure.
Figure 5B:
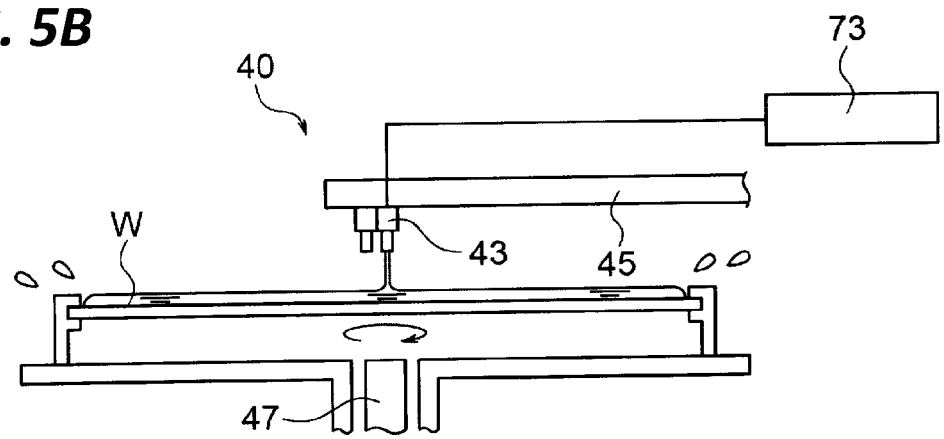

After completion of the cleaning process, the discharge of the droplet from the cleaning liquid nozzle 41 is stopped while the wafer W is continuously rotated, and the rinsing liquid is supplied from the rinse nozzle 43, positioned above the central portion of the wafer W, to the central portion of the wafer W, whereby a rinsing processing is performed to wash away the cleaning liquid and the reaction product remaining on the surface of the wafer W (see FIG. 5B). At this time, the discharge flow rate of the rinsing liquid from the rinse nozzle 43 may be, for example, 100 ml/sec or more and 2000 ml/sec or less. Further, the discharge temperature of the rinsing liquid may be, for example, 20° C. or higher and may be lower than the boiling point of the rinsing liquid. As described above, the rinsing liquid is formed of a liquid substantially containing no moisture, for example, isopropyl alcohol (IPA). Therefore, there is no possibility that magnesium oxide contained in the tunnel insulating layer 83 of the wafer W reacts with moisture in the rinsing liquid to thereby be hydroxylated when the rinsing liquid washes away the cleaning liquid and the reaction product on the surface of the wafer W. Further, the rinsing liquid does not adversely affect each layer other than the tunnel insulating layer 83 of the wafer W.

<Drying Process>

Figure 5C:
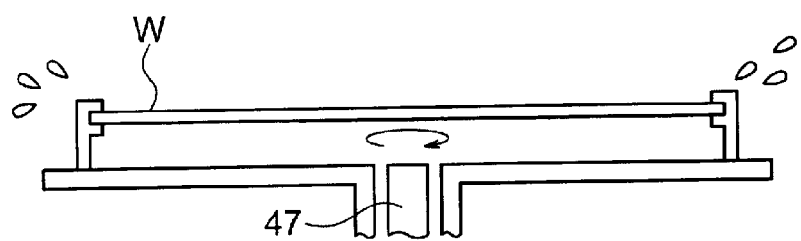

After completion of the rinsing process, the supply of the rinsing liquid from the rinse nozzle 43 is stopped, and the number of revolutions of the wafer W is increased to scatter the rinsing liquid remaining on the wafer W by a centrifugal force, whereby the surface of the wafer W is dried (see FIG. 5C). The rotational speed of the wafer W at this time may be, for example, 500 rpm or more and 2000 rpm or less. Further, between the rinsing process and the drying process, the discharge flow rate of the rinsing liquid may be reduced to less than 100 ml/sec so that a thin liquid film of the rinsing liquid is formed on the surface of the wafer W, and a dry gas nozzle (not illustrated) may be moved toward the peripheral edge portion of the wafer W while supplying a dry gas (e.g., an inert gas such as $N_2$) to the central portion of the wafer W from the dry gas nozzle. Thereby, the drying time may be shortened.

In this way, a series of liquid processings for one wafer W is completed. Thereafter, the wafer W is carried out of the processing unit 16. After being carried out of the processing unit 16, a process of forming a protective film, which protects the respective films on the substrate main body 84 on the surface of the wafer W by a CVD method, may be provided.

According to the above exemplary embodiment, the cleaning liquid is supplied from the cleaning liquid nozzle 41 to the wafer W, whereby the substrate is cleaned. Thereafter, the rinsing liquid is supplied from the rinse nozzle 43 to the wafer W, whereby the cleaning liquid is rinsed. Since the cleaning liquid and the rinsing liquid are substantially free of moisture, there is no possibility that moisture in the cleaning liquid and the rinsing liquid reacts with magnesium oxide in the wafer W and strong alkaline magnesium hydroxide is produced. Thereby, it is possible to prevent the wafer W from being corroded by the magnesium hydroxide. Further, there is no possibility that the tunnel insulating layer 83 is dissolved and removed. In this manner, since contaminants such as, for example, particles and polymers attached to the wafer W may be removed without corroding the wafer W, it is possible to prevent etching residues from being generated due to, for example, polymers, or deterioration in the yield.

Meanwhile, in the above exemplary embodiment, the case where the FFU 21, which forms a downflow in the chamber 20, is provided on the ceiling portion of the chamber 20, has been described by way of example. However, the present disclosure is not limited to this, and as illustrated in FIG. 6, a clean gas supply mechanism 90 may be provided on the ceiling of the chamber 20, instead of the FFU 21 or in addition to the FFU 21.

Figure 6:
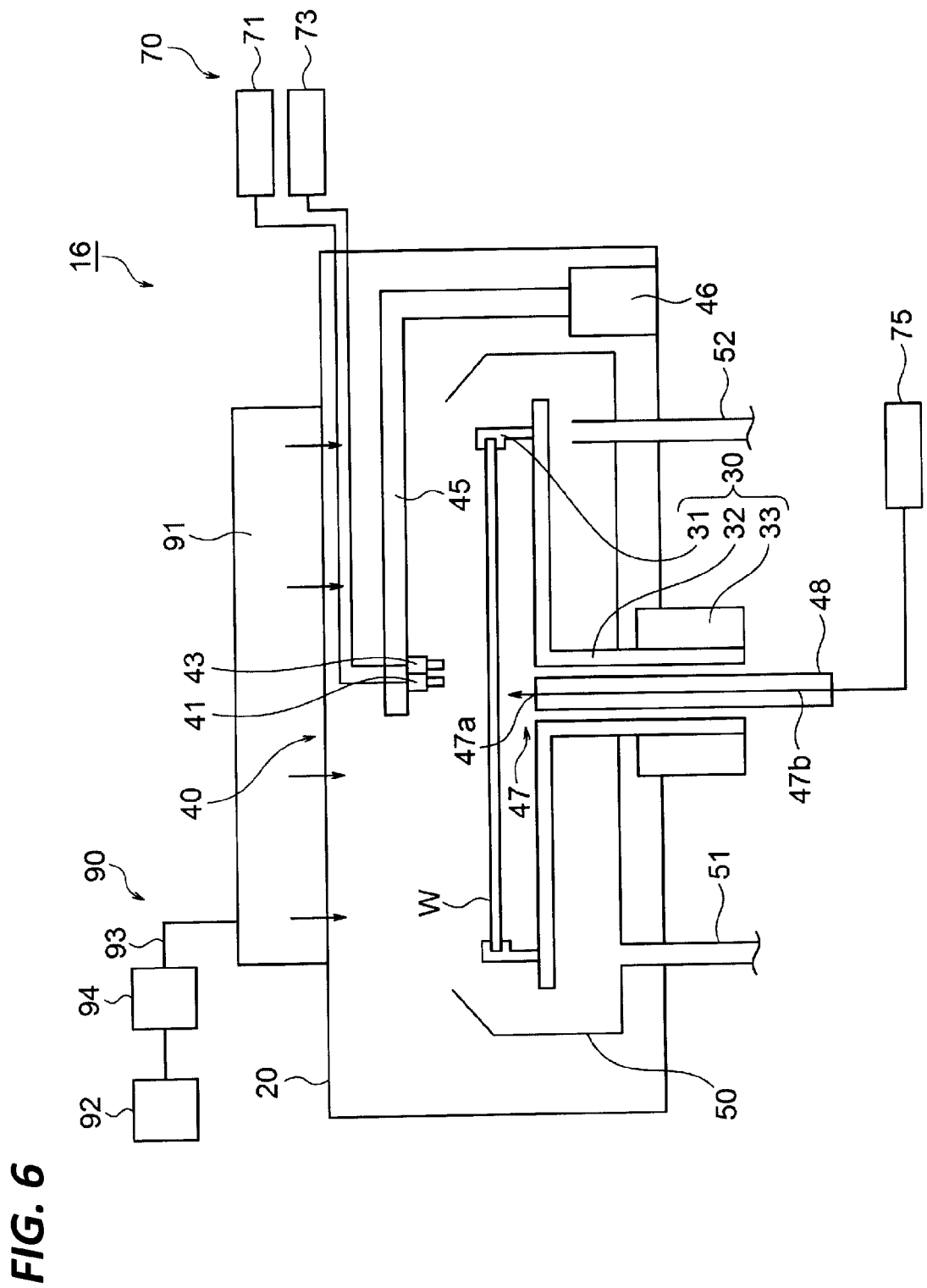
FIG. 6 is a longitudinal sectional view illustrating an outline of a processing unit (substrate liquid processing apparatus) according to a modification of the present disclosure.

In FIG. 6, the clean gas supply mechanism 90 supplies a low humidity gas, which is called dry air. The clean gas supply mechanism 90 has a gas supply mechanism 91, which supplies dry air to the inner space of the chamber 20. The dry air is supplied to the gas supply mechanism 91 from a gas supply source 92 (dry air generation device) through a gas supply path 93. A fluid regulator 94 such as, for example, the opening/closing valve and a regulating valve, which regulates the flow rate or pressure of the gas is interposed in the gas supply path 93. The clean gas supply mechanism 90 supplies the dry air into the chamber 20 during the cleaning process, the rinsing process, and the drying process, so that the humidity of the atmosphere in the chamber 20 is a low humidity, specifically, the dew point temperature is −40° C. or less. For example, the dew point temperature may be adjusted to a range from −110° C. to −120° C. In particular, by performing the cleaning process and the rinsing process in the atmosphere of low humidity, dissolution of moisture in the air into the cleaning liquid and the rinsing liquid may be prevented, and magnesium oxide in the wafer W reacts with moisture in the cleaning liquid and the rinsing liquid may be prevented more effectively. The low humidity gas supplied to the inner space of the chamber 20 is not limited to the dry air, but may be an inert gas or any other gas as long as it causes the humidity of the atmosphere in the chamber 20 to be a low humidity.

Further, in the above-described exemplary embodiment, the case where the processing fluid supplied from the lower nozzle 47 is formed of a liquid substantially containing no moisture such as, for example, IPA has been described by way of example. However, the present disclosure is not limited to this, and the processing liquid supplied from the lower nozzle 47 may be a processing liquid containing moisture such as DIW. Since there is no layer containing magnesium oxide on the back side of the wafer W, there is no possibility that moisture in the processing fluid does not directly come into contact and reacts with the magnesium oxide. On the other hand, when DIW is used as the processing fluid, it is possible to reduce the consumption amount of IPA, whereby the cost required for the cleaning processing may be reduced and deterioration of the working environment may be prevented.

Further, the low humidity gas may be supplied to the transfer section 12 of the wafer (W) carry-in/out station 2 and the transfer section 15 of the processing station 3. By performing the transfer of the wafer W between the carrier C and the processing unit 16 in the atmosphere of low humidity, it is possible to prevent the magnesium oxide of the wafer W from reacting with moisture in the transfer section even during transfer.

The present disclosure is not limited to the above exemplary embodiment as it is, and constituent elements may be modified and embodied in the implementation stage without departing from the spirit of the invention. Further, various inventions may be formed by appropriately combining a plurality of constituent elements disclosed in the above exemplary embodiment. Several constituent elements may be deleted from all constituent elements illustrated in the exemplary embodiment. Further, the constituent elements of different embodiments may be appropriately combined.

What is claimed is:

1. A substrate liquid processing method comprising:
   preparing a substrate including a first magnetic layer, a second magnetic layer, and a tunnel insulating layer formed of magnesium oxide and disposed between the first magnetic layer and the second magnetic layer;
   cleaning the substrate by supplying a cleaning liquid to the substrate; and
   rinsing the cleaning liquid by supplying a rinsing liquid to the substrate,
   wherein a concentration of moisture contained in the cleaning liquid and the rinsing liquid is 3 wt % or less.

2. The method of claim 1, wherein the cleaning liquid is an organic solvent.

3. The method of claim 1, wherein the rinsing liquid is IPA.

4. The method of claim 1, wherein the cleaning and the rinsing are performed in an atmosphere in which a dew point temperature is −40° C. or less.

5. A substrate liquid processing apparatus comprising:
   a substrate holder configured to hold a substrate including a first magnetic layer, a second magnetic layer, and a tunnel insulating layer formed of magnesium oxide and disposed between the first magnetic layer and the second magnetic layer;

a cleaning liquid nozzle configured to supply a cleaning liquid, which cleans the substrate, to the substrate; and a rinse nozzle configured to supply a rinsing liquid, which rinses the cleaning liquid, to the substrate, wherein a concentration of moisture contained in the cleaning liquid and the rinsing liquid is 3 wt % or less.

6. The apparatus of claim 5, wherein the cleaning liquid is an organic solvent.

7. The apparatus of claim 5, wherein the rinsing liquid is IPA.

8. The apparatus of claim 5, wherein the substrate holder, the cleaning liquid nozzle, and the rinse nozzle are accommodated in a chamber, and a dew point temperature of an atmosphere in the chamber is adjusted to be −40° C. or less.

9. A non-transitory computer-readable storage medium storing a program that, when executed, causes a computer to control a substrate liquid processing apparatus to perform the substrate liquid processing method of claim 1.

* * * * *